United States Patent [19]
Seng et al.

[11] Patent Number: 6,150,894
[45] Date of Patent: Nov. 21, 2000

[54] OSCILLATOR HAVING MINIMUM FREQUENCY AND AMPLITUDE FLUCTUATION DUE TO TEMPERATURE VARIATION

[75] Inventors: Yap Hwa Seng; Aruna Bopaiah Ajjikuttira, both of Sinapore, Singapore

[73] Assignee: Tritech Microelectronics Ltd., Singapore, Singapore

[21] Appl. No.: 09/270,597

[22] Filed: Mar. 18, 1999

[51] Int. Cl.⁷ .................................................. H03L 1/00
[52] U.S. Cl. ..................... 331/175; 331/176; 331/116 R; 331/179; 332/102
[58] Field of Search ............................... 331/154, 116 M, 331/116 R, 179, 175, 176; 332/102, 100

[56] References Cited

U.S. PATENT DOCUMENTS

| | | | |
|---|---|---|---|
| 5,168,251 | 12/1992 | Zennamo, Jr. et al. ................. | 333/175 |
| 5,367,537 | 11/1994 | Anderson .................................. | 375/65 |
| 5,532,654 | 7/1996 | Ieki et al. ................................. | 332/102 |
| 5,793,261 | 8/1998 | Boling, III .............................. | 332/102 |
| 6,078,226 | 6/2000 | Ajjikuttira ............................... | 331/179 |

OTHER PUBLICATIONS

Smith, "Modern Communication Circuits", Mc Graw–Hill, Inc., 1986, NY, pp. 230–239.

*Primary Examiner*—Robert Pascal
*Assistant Examiner*—Kimberly E Glenn
*Attorney, Agent, or Firm*—George O. Saile; Stephen B. Ackerman; Billy Knowles

[57] ABSTRACT

An oscillator circuit, whose output signal has minimum fluctuation with changes in temperature, has an amplifier. Within the amplifier, a compensation resistor is connected to compensate for changes in amplitude and frequency of the output signal with temperature. A first impedance is connected between an output and a first input of the amplifier, a second impedance is connected between the first input and a second input, and a third impedance is connected between the output and the second input. A method for designing the oscillator begins by choosing an inductor with a high quality factor and a low temperature coefficient. The interconnections are designed to minimize temperature effects of parasitic impedances. A degenerative resistor is connected between the emitter of the bipolar transistor and the emitter resistor. The degenerative resistor varies in resistance with a change in temperature opposite that of an input resistance of the bipolar junction transistor. The first and second capacitors are selected to minimize the effect of variation of the parasitic impedance. The oscillator is converted to a frequency shift keying oscillator by adding frequency shifting means to modulate the frequency of the output signal between a first frequency and a second frequency according to a state of a digital input signal. The method of designing the oscillator as a frequency shift keying oscillator requires selecting an on-resistance of the frequency shifting means to prevent the first frequency and the second frequency from fluctuating with temperature.

32 Claims, 10 Drawing Sheets

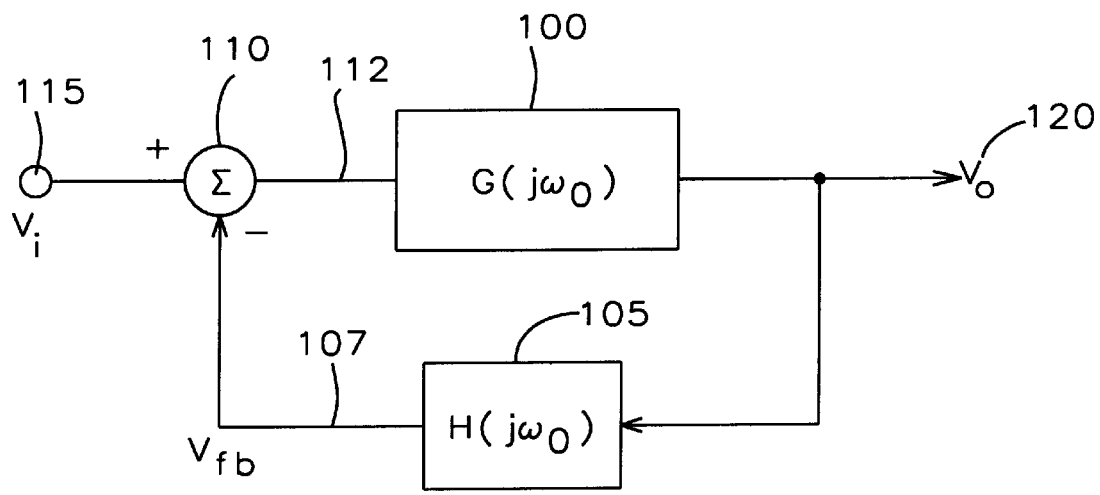
*FIG. 1 - Prior Art*
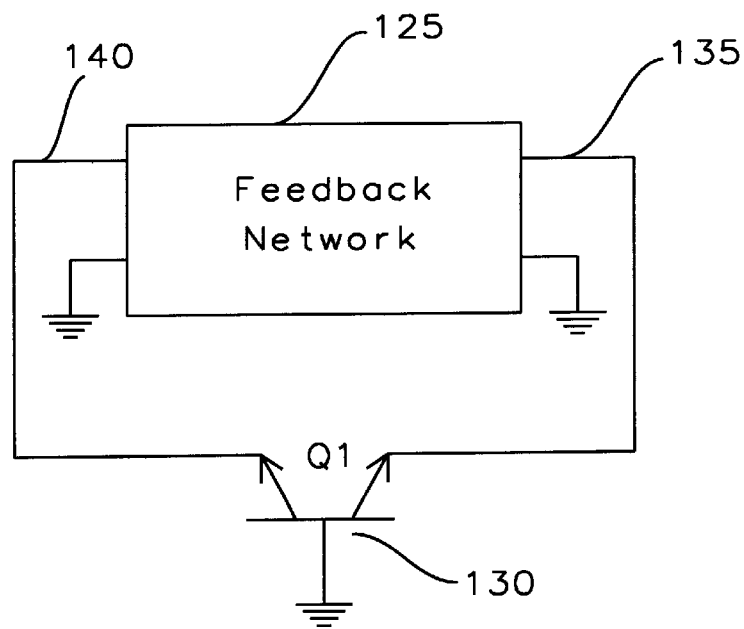
*FIG. 2 - Prior Art*

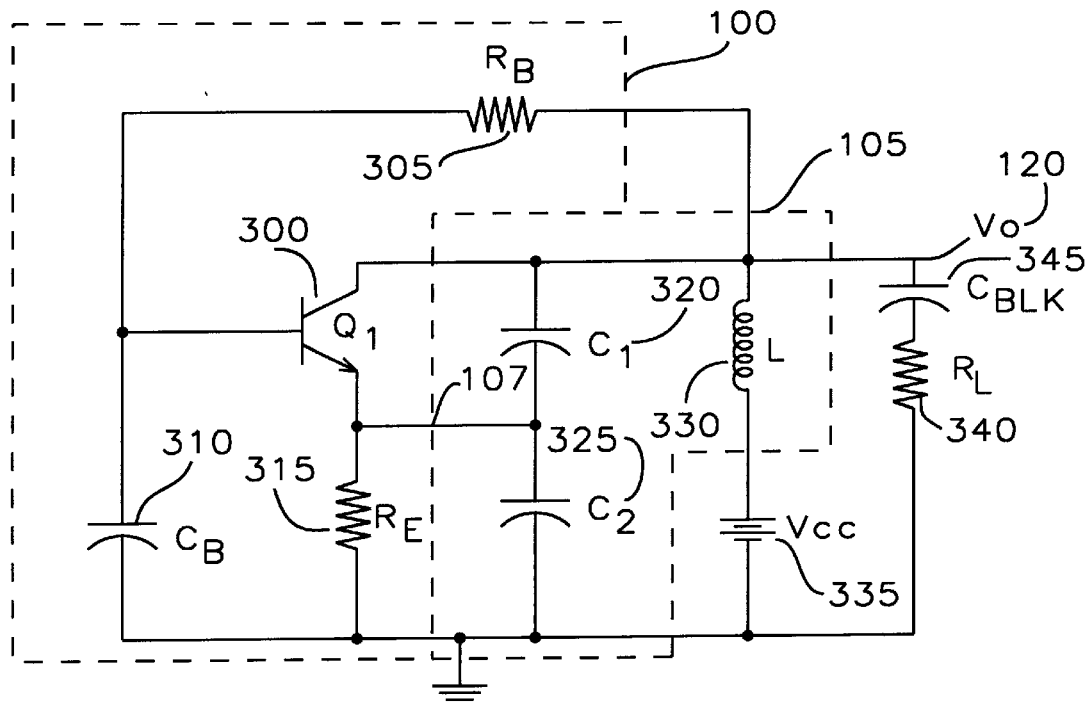
FIG. 3a – Prior Art
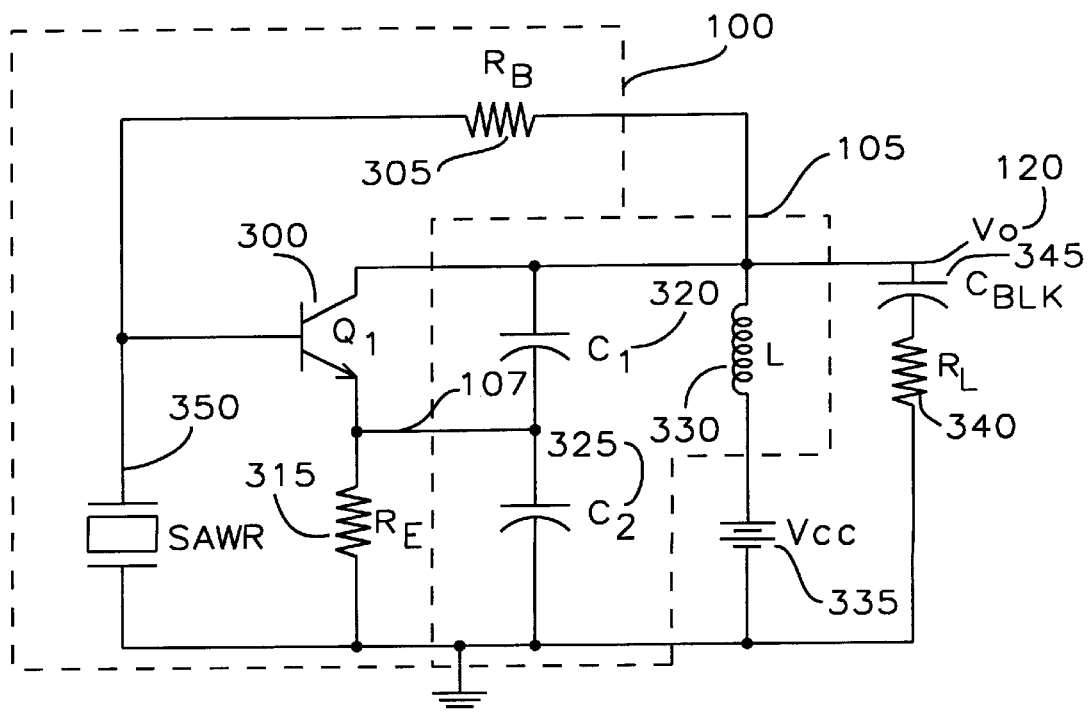
FIG. 3b – Prior Art

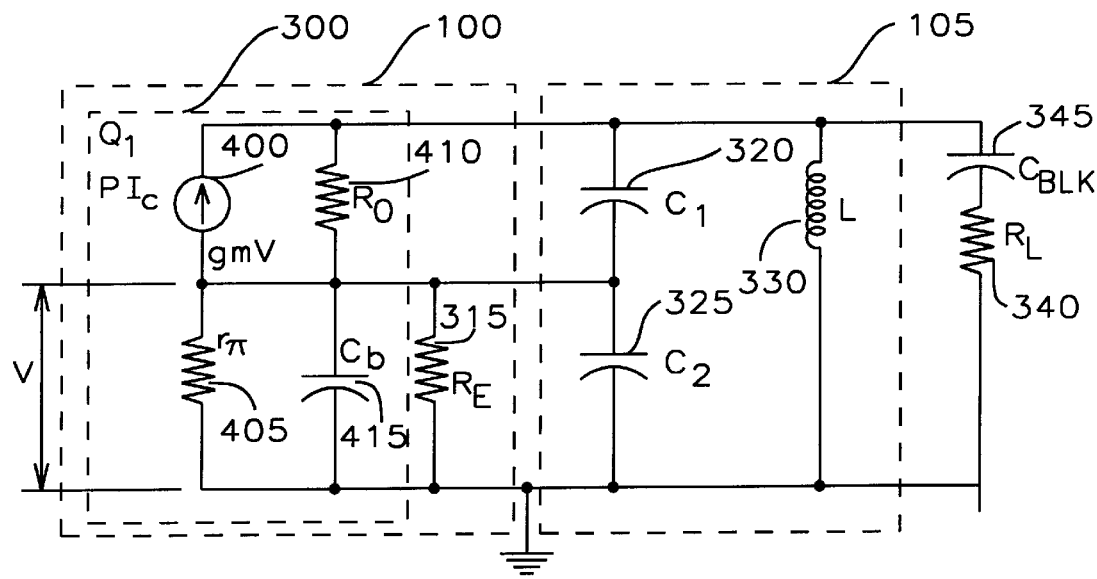
*FIG. 4a – Prior Art*
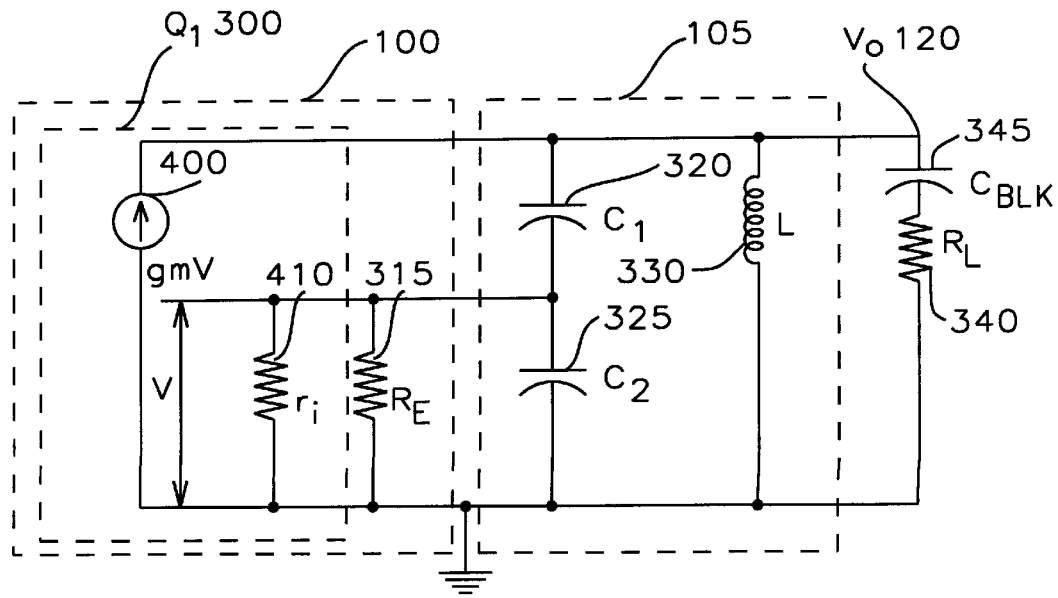
*FIG. 4b – Prior Art*

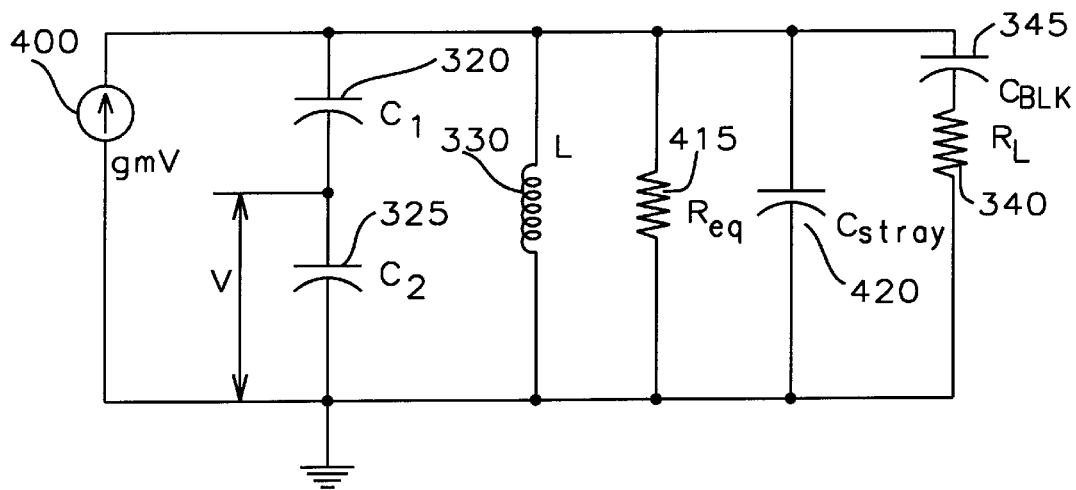
*FIG. 4c - Prior Art*
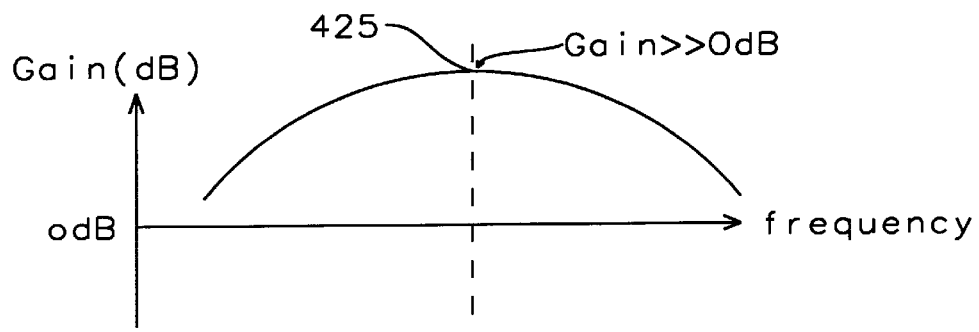
*FIG. 4d - Prior Art*
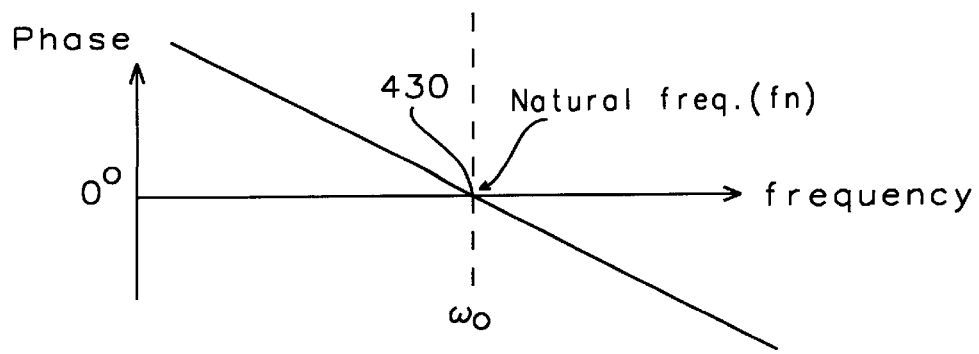
*FIG. 4e - Prior Art*

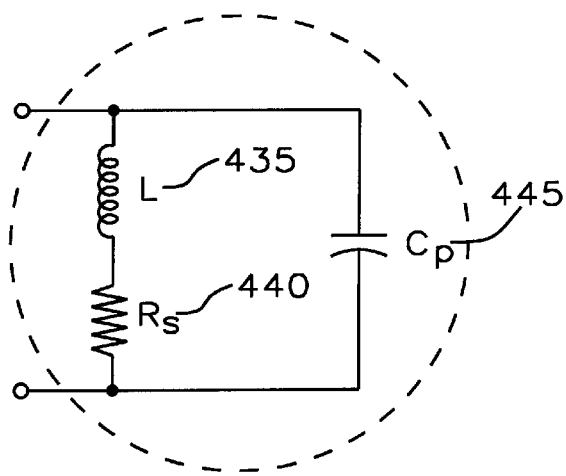
FIG. 4f - Prior Art
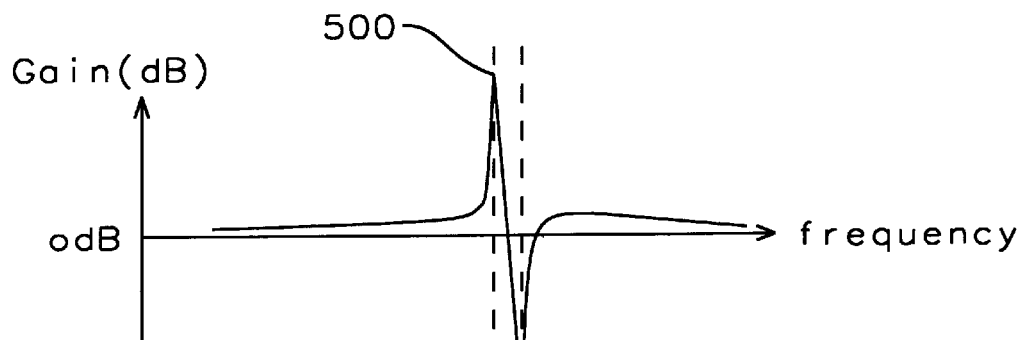
FIG. 5a - Prior Art
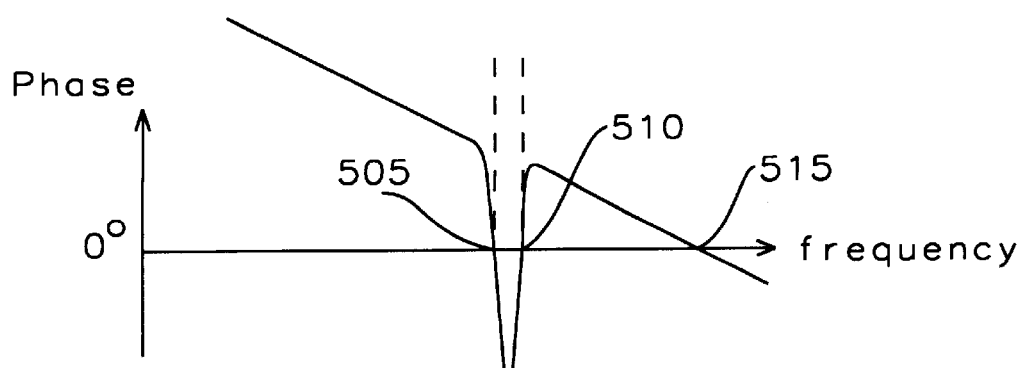
FIG. 5b - Prior Art

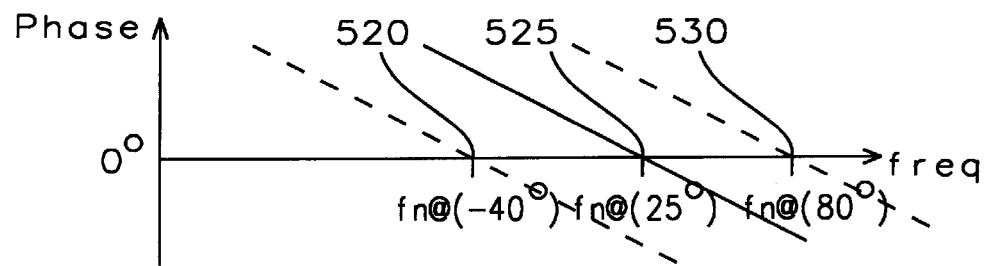
FIG. 6a – Prior Art
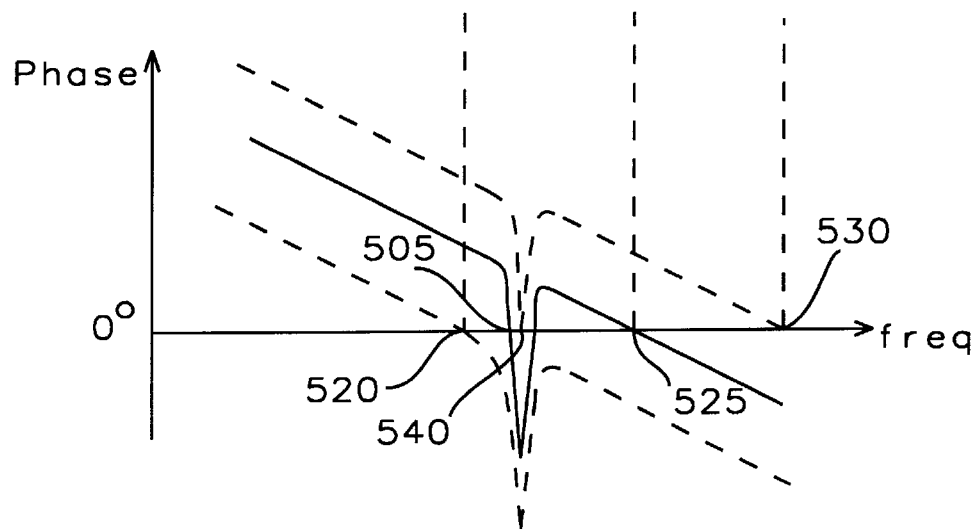
FIG. 6b – Prior Art

OSCILLATOR HAVING MINIMUM FREQUENCY AND AMPLITUDE FLUCTUATION DUE TO TEMPERATURE VARIATION

BACKGROUND OF THE INVENTION

1. Field of the Invention

This invention relates generally to electronic oscillating circuits and more particularly to oscillators wherein fluctuation of frequency and amplitude of the oscillator is minimized with variation of temperature.

2. Description of Related Art

Oscillators and modulation of frequencies for Frequency Shift Keying (FSK) transmission of digital data signals is well known in the art. A review of a general form of the criteria for designing an oscillator circuit of the prior art is described in *Modern Communication Circuits*, Jack Smith, McGraw-Hill, 1986, New York, and shown in FIG. 1. The necessary components of an oscillator are a frequency dependent gain circuit 100, a frequency dependent feedback circuit 105, and a combining block 110. The output $V_o$ 120 of the gain circuit 100 is the input to the feedback circuit 105. The input signal $V_i$ 115 is combined with the output $V_{fb}$ 107 of the feedback circuit 105 to form the input 112 of the gain circuit 100.

The gain of the gain block 100 is designated $G(j\omega)$ and the gain of the feedback circuit 105 is designated $H(j\omega)$. These gains $G(j\omega)$ and $H(j\omega)$ describe the relationship of their respective output signals $V_o$ 120 and $V_{fb}$ 107 to their respective input signals 112 and $V_o$ 120. Therefore, the output signal $V_o$ 120 becomes $$V_o = \frac{V_i G(j\omega)}{1 + G(j\omega)H(j\omega)}$$

For an oscillator, the output signal $V_o$ 120 must be nonzero even if the input voltage $V_i$ 115 is zero. For this to be true, then $$1 + G(j\omega)H(j\omega) = 0$$

or $$G(j\omega)H(j\omega) = -1.$$

That is, the magnitude of the open-loop transfer function must be equal to 1 and the phase shift of the gain circuit 100 and the feedback circuit 106 must be 180°.

FIG. 2 shows a common base amplifier. There is fundamentally no phase shift between signals at the emitter and the collector of the transistor Q1 130. The feedback circuit is designed to meet the Nyquist criteria, where the amplitude of the input 135 of the feedback circuit 125 is equal to and out of phase from the amplitude of the output 140.

Theoretically, the transistor Q1 130 is ideal and has no frequency components. Therefore, the feedback circuit determines the single frequency of oscillation of the circuit.

FIG. 3*a* shows a basic oscillator circuit. The transistor Q1 300, capacitor $C_B$ 310, the base biasing resistor $R_B$ 305, and the emitter resistor $R_E$ 315 form the gain circuit 100. The input 120 of the feedback circuit 105 is at the collector of the transistor Q1 300. The feedback circuit 105 consists of the inductor L 330 in parallel with the series combination of the first capacitor $C_1$ 320 and the second capacitor $C_2$ 325. The output 107 of the feedback circuit 105 is connected to the emitter of the transistor Q1 300.

The base biasing resistor $R_B$ 305 provides a biasing current from the power supply voltage source $V_{CC}$ 335 to the base of the transistor Q1 300. The base capacitor $C_B$ 310 is sufficiently large that the impedance of the base capacitor $C_B$ 310 is very small at the frequency of interest thus forming the common base transistor of FIG. 2.

The voltage developed at the output 107 of the feedback circuit 105 is developed across the emitter resistor $R_E$ 315 creating the emitter current of the transistor Q1 300 which in turn creates the collector current of the transistor Q1 300. The load resistor $R_L$ 340 sinks the collector current to develop the output signal $V_o$ 120. The blocking capacitor $C_{BLK}$ 345 prevents any D.C. current from flowing through the load resistor $R_L$ 340.

FIG. 4*a* shows a simplified equivalent circuit of the oscillator of FIG. 3. The transistor Q1 300 is represented by the standard Hybrid $\pi$ model. For simplicity of calculation, the output resistance $R_o$ 410 and the impedance of the base charging capacitance $C_b$ 415 are ignored. This is because their magnitude is sufficiently small to have little effect on the oscillator design. The small signal input resistance $r_\pi$ 405 is given as:

$$r_x = \frac{V_{be}}{I_c} \beta_o$$

where $V_{be}$ is the base-emitter voltage.

$I_c$ is the collector current.

$\beta_o$ is the small signal current gain.

The collector current $I_c$ is provided by the current source 400 and the current is determined by the function:

$$I_c = g_m V_{be}$$

where $g_m$ is the transconductance of the transistor Q1 300.

The requirements for oscillation as stated above are for the open loop gain of the combination of the gain circuit 100 and the feedback circuit 105 to be equal to 1 and the phase shift of the gain circuit 100 and the feedback circuit 105 to be 0°. To examine the open loop gain of the oscillator of FIG. 3*a* refer now to FIG. 4*b*. It is well known, that the when the loop is opened, the impedances at each node should be equal to those of the dosed loop. Therefore, the input resistance $r_i$ 410 is determined as:

$$r_i = \frac{r_\pi}{\beta_o} = \frac{1}{g_m} = \frac{KT}{qI_c}$$

where $$\frac{KT}{q}$$

is the voltage equivalent of temperature.

It can be further shown by circuit analysis that the input resistance input resistance $r_i$ 410 and the emitter resistance $R_E$ 315 can be transformed to the equivalent resistor $R_{eq}$ 415 of FIG. 4*c*. The equivalent resistor $R_{eq}$ 415 is determined by the formula:

$$Req = \frac{r_i R_e}{r_i + R_e} \left(\frac{C_1 + C_2}{C_1}\right)^2.$$

The voltage V is further determined as:

$$V = \frac{V_o C_1}{C_1 + C_2}.$$

From the above the forward loop gain $G(j\omega)$ of the gain circuit 100 is determined as:

$$G(j\omega) = \frac{V_o}{V} = I_c Z_L = g_m Z_L$$

where $Z_L$ is the impedance from the output node $V_o$ 120 to the ground reference point and is:

$$Z_L^{-1} = (j\omega L)^{-1} + R_{eq}^{-1} + R_L^{-1} + (j\omega C)$$

where

C is the series combination of the first capacitor $C_1$ 320 and the second capacitor $C_2$ 325 and determined as $$C = \frac{C_1 C_2}{C_1 + C_2}.$$

The feedback gain $H(j\omega)$ of the feedback circuit 105 is determined as:

$$H(j\omega) = \frac{V}{V_o} = \frac{C_1}{C_1 + C_2}.$$

For the circuit to oscillate, the phase shift through the combination of the gain circuit 100 and the feedback circuit 105 is not dependent on frequency, the phase shift of the gain circuit 100 must be 0°. Since the phase shift of the gain block 100 is not dependent on frequency, the phase shift of the feedback circuit 105 must be zero. This occurs at one frequency ($\omega_0$). The frequency $\omega_0$ is determined as:

$$\omega_o = \frac{1}{\sqrt{L \frac{C_1 C_2}{C_1 + C_2}}}.$$

At the frequency, the impedance $Z_L$ becomes:

$$Z_L = \frac{R_{eq} R_L}{R_{eq} + R_L},$$

and the open loop gain $G(j\omega)H(j\omega)$ of the oscillator becomes:

$$G(j\omega)H(j\omega) = g_m \frac{R_{eq} R_L}{R_{eq} + R_L} \frac{C_1}{C_1 + C_2}.$$

The final condition for oscillation is that open loop gain $G(j\omega)H(j\omega)$ equal to 1.

FIGS. 4d and 4e are gain and phase diagrams of the circuit of FIG. 4a showing the open loop gain and open loop phase of the circuit. As shown above, the circuit will oscillate naturally when the loop is closed at a frequency $\omega_0$. This frequency is where the gain is maximum 425 and the phase shift is zero 430.

The fundamental frequency of oscillation $f_0$ and the amplitude $V_O$ can be made to fluctuate or vary from their respective designed values by changes in temperature and the magnitude of parasitic or stray capacitance $C_{stray}$ 420.

In practical implementations, the inductor L 330 is modeled as shown in FIG. 4F. The resistor $R_s$ 440 represents the resistance inherent in the conductor used to form the inductor L 330. The inductor L 435 is the ideal inductance of the conductor and is a function of the cross-sectional area, the length, and the permeability of the surrounding environment.

The cross-sectional area and the length of the conductor that forms the inductor L 330 changes with temperature. These changes thus change the value of the ideal inductor L 435. The changes of the value of the ideal inductor L 435 are difficult to predict and are best characterized by measurement.

The capacitor $C_P$ 445 is the distributed capacitance between each winding of the inductor L 330. Generally, this capacitance is considered a contributor to the stray capacitance $C_{stray}$ 420 of FIG. 4c, but has a negligible effect on the value of the stray capacitance $C_{stray}$ 420 of FIG. 4c.

The capacitor $C_{stray}$ 420 of FIG. 4c, in addition to the interwinding capacitance of the inductor L 330, also consists of the output capacitance of the transistor Q1 300, the capacitance of the interconnection traces on the semiconductor die from the collector of the transistor Q1 300, the wirebonds from the semiconductor die to the lead frame, and the wiring traces of printed circuit board connecting the components of the oscillator. The capacitor $C_{stray}$ 420 is in parallel with the series combination of the first and second capacitors $C_1$ 320 and $C_2$ 325 and will change the natural frequency of oscillation $\omega_0$ of the oscillator. The output capacitance of the transistor Q1 300 is particularly sensitive to changes in temperature and provide the greatest sensitivity of the capacitor $C_{stray}$ 420 to temperature.

The input resistor $R_\pi$ 405 of the transistor Q1 300 of FIG. 4a, the emitter resistor $R_E$ 315, the series resistance $R_S$ 440 of the inductor L 330 and the load resistance $R_L$ 340 determine the amplitude of the of the output signal. Each of these resistances will vary according to their independent temperature coefficients (TC). The temperature coefficient indicate the amount of variance each resistance changes with a change in temperature. These changes with temperature will thus change the amplitude of the voltage developed across the load resistance $R_L$ 340.

FIG. 3b illustrates a common base transistor oscillator in which the base capacitance $C_B$ 310 is replaced with a surface acoustic wave resonator (SAWR) 350. In this instance, the gain block 100 now has the frequency response of the SAWR 350 as a determinant of the natural frequency of oscillation. FIGS. 5a and 5b show respectively the gain and phase of the common base transistor oscillator of FIG. 3b. The open loop gain of the common base transistor oscillator of FIG. 3b has a peak 500 when the phase 505 is 0° indicating the frequency $f_o$ of oscillation. This is the point of serial resonance $f_s$ of the SAWR 350 of FIG. 3b. There are two other points with a 0° phase shift 510 and 515. These are the point of parallel resonance $f_p$ of the SAWR 350 of FIG. 3b and the point of resonance $f_o$ of the feed back circuit 105. The gain at these two points 510 and 515 is not sufficient to sustain oscillation.

FIGS. 6a and 6b illustrate the effect of temperature on the frequency of oscillation of the common base transistor oscillator of FIGS. 3a and 3b. FIG. 6a shows the plots of the open loop phase shift of the common base transistor oscillator of FIG. 3a at the temperatures of 40° C., +25° C., and +80° C. As can be seen, the frequency of oscillation drifts from the point 520 at −40° C. to the point 525 at +25° C., to the point 530 at +80° C. It is well known in the art that the frequency of oscillation $f_o$ is found by the function:

$$f_o = \frac{1}{2\pi\sqrt{LC_{eff}}}$$

where:

L is the inductor L 330 of FIG. 4a.

$C_{eff}$ is the stray capacitor Cstray 420 of FIG. 4a in parallel with the series combination of the first capacitor $C_1$ 320 and the second capacitor $C_2$ 325 of FIG. 4a and is determined as $$C = \frac{C_1 C_2}{C_1 + C_2}.$$

The temperature coefficient of the inductor L 330 of FIG. 4a is from approximately 25 ppm/° C. to approximately 125 ppm/° C. The first capacitor $C_1$ 320 and the second capacitor $C_2$ 325 of FIG. 4a each have a temperature coefficient of approximately 50 ppm/° C. The capacitance of the stray capacitor Cstray 420 is not easily predicted or controlled and further has a higher temperature coefficient compared to that of the first capacitor $C_1$ 320 and the second capacitor $C_2$ 325 of FIG. 4a. To minimize the effect of the stray capacitor Cstray 420, the value of the first capacitor $C_1$ 320 and the second capacitor $C_2$ 325 are made larger.

FIG. 6b shows the open loop phase of the common base transistor oscillator of FIG. 3b employing the SAWR 350. The frequency of resonance of the SAWR is relatively insensitive to temperature. However, in combination with components of the feedback circuit 105, the open loop phase of the common base transistor oscillator is a combination of the phase shift of the feedback circuit 105 and the SAWR 350. Consequently, the temperature effects show that the common base transistor oscillator of FIG. 3b has a 0° phase at the natural frequency 520 of the feedback circuit 105 for a temperature of −40° C. On the other hand, the open loop phase of the common base transistor oscillator of FIG. 3b may marginally reach 0° phase shift at the frequency 540 of the SAWR 350 for a temperature of +80° C. The only predictable frequency of oscillation 505 is at 25° C. The above indicates that the frequency of the common base transistor oscillator can not be well controlled over large changes in temperature. This instability of frequency limits the application of the common base transistor oscillator in applications having environments with extreme changes in temperature such as Radio Frequency Identification (RFID) and telemetry.

U.S. Pat. No. 5,367,537 (Anderson) describes a transmitter having improved noise immunity characteristics relative to Amplitude Shift Keying methods currently utilized in the art and a wide deviation in frequency between a first and second transmission frequency corresponding to binary data transmission in FSK modulating transmitter. Anderson describes a low-power requirement FSK modulating circuit, which has an oscillation amplifier tuned for RF oscillation and responsive to oscillatory input thereto. A Surface Acoustic Wave (SAW) transducer having a natural resonant frequency in a stand alone oscillatory configuration provides a frequency for the FSK modulating circuit. A single reactive component located between the SAW transducer and the RF oscillator amplifier provides a pulling effect upon the SAW natural resonant frequency so to change the oscillatory frequency input to the RF oscillator amplifier to a second frequency. A PIN switching diode in parallel with the reactive component provides a bypass of that reactive component such that the SAW transducer provides its natural resonant frequency as an input to the RF oscillator amplifier. Means for forward and reverse biasing the PIN diode provide selective control over these two independent frequencies.

U.S. Pat. No. 5,532,654 (Ieki et al.) describes an FSK modulator. The FSK modulator has an amplifier for oscillation, a SAW resonator connected in series with a switching circuit containing one or more fixed capacitors. The capacitors are switched in series with the SAW resonator to switch the frequency of oscillation of the modulator according to a signal at the input of the switching circuit.

U.S. Pat. No. 5,168,251 (Zennano, Jr. et al.) is based on the recognition that the Q of a tuned filter can be improved, while minimizing the overall size of the filter to within restricted cavity size limitations, by respectively replacing single inductors and capacitors in conventional filter structures with parallel multiple inductors and/or multiple series capacitors as required. More specifically, Zennano, Jr. et al. describes a tuned filter is provided that includes an input terminal and an output terminal; a first network coupled to the input terminal and electrical ground including a plurality of series capacitors and/or a plurality of parallel inductors; and a second network coupled to the input terminal and the output terminal including at least one of a plurality of series capacitors and/or a plurality of parallel inductors. The quality factor (Q) of the filter is improved by the use of the series capacitors and/or parallel inductors as opposed to single capacitors or inductors.

U.S. Pat. No. 5,793,261 Bolling, III) describes a digitally controlled SAW stabilized FSK oscillator circuit having an oscillator and a single-port SAWR with a pre determined circuit resonant frequency and being coupled to the oscillator for establishing a first oscillator output frequency. $F_{SAW}$. A bipolar transistor has at least one predetermined shunt capacitance value C that is placed in electrical series with the single-port SAWR when the transistor is in the OFF state and a closed switch that replaces the capacitance when the transistor is in the ON state to cause the first frequency $F_1$ to be generated by the oscillator when the transistor is ON and to cause a second frequency. $F_2$ to be generated by the oscillator when the transistor is in the OFF state.

SUMMARY OF THE INVENTION

An object of this invention is to provide an oscillator circuit that has an output signal whose frequency and voltage amplitude has minimum fluctuation with changes in temperature.

Another object of this invention is to provide an oscillator that produces multiple frequencies dependent on a digital input signal. The multiple frequencies will have minimum fluctuation with changes in temperature.

To accomplish these and other objects an oscillator has an amplifier with and output signal having a frequency and amplitude that fluctuates with temperature to a first extent. Within the amplifier, a compensation resistor is connected to cause the amplitude and frequency of the output signal to fluctuate with temperature to a second extent. The second extent is opposite to the first extent to compensate the fluctuation to the first extent. A first impedance is connected between an output of the amplifier and a first input of the amplifier, a second impedance is connected between the first input of the amplifier and a second input of the amplifier, and a third impedance is connected between the output of the amplifier and the second input of the amplifier.

A parasitic impedance is present between the output of the amplifier and the second input of the amplifier. The parasitic impedance represents the resistance, inductance, and capacitance of the interconnections from the amplifier to external circuitry. An additional contributor to the parasitic impedance is the output capacitance of the amplifier.

The first, second, and third impedances determine the frequency of the oscillator. The third impedance has a high quality factor and a low temperature coefficient to prevent fluctuation of the frequency. The second impedance is much smaller than the first impedance, which is much smaller than the parasitic impedance to minimize temperature effects on frequency of the oscillator.

The third impedance is an inductor with a quality factor of greater than 20. The first and second impedances are capacitors having low temperature coefficients.

The first and second impedances are related to the parasitic impedance by the formula:

$$C_P \ll \frac{C_1 C_2}{C_1 + C_2}$$

where:

$C_P$ is the parasitic impedance, $C_1$ is the first impedance, and $C_2$ is the second impedance.

The oscillator of this invention is made to be a frequency shift keying oscillator by connecting a frequency shifting means to the amplifier to modulate the frequency of the output signal between a first frequency and a second frequency according to a state of a digital input signal to make the oscillator a frequency shift keying oscillator. The frequency shifting means has an on-resistance, which is of a magnitude that will prevent the first frequency and the second frequency from fluctuating with temperature.

A practical embodiment of the oscillator of this invention has a bipolar transistor. A biasing means is connected between a power supply voltage source and the base of the bipolar junction transistor to provide a biasing for the bipolar junction transistor. A surface acoustic wave resonator has a first terminal connected to the base of the transistor to control the frequency of oscillation. An emitter resistor has a first terminal connected to a ground reference point. A first capacitor is connected between the collector of the bipolar junction transistor and the second terminal of the emitter resistor. A second capacitor is connected between the second terminal of the emitter resistor and the ground reference point, and an inductor is connected between the collector of the bipolar junction transistor and the power supply voltage source.

A method for designing the practical embodiment of the oscillator begins by choosing the inductor to have a high quality factor (greater than 20) and a low temperature coefficient (25 ppm/° C. to 125 ppm/° C.) to prevent fluctuations in the frequency and the amplitude. The interconnections, which include chip traces, wire bonds, and card traces, are designed to have minimum resistance and minimum stray capacitance from the collector of the bipolar junction transistor the inductor and the first and second capacitances. A degenerative resistor has a first terminal connected to the emitter of the bipolar transistor and a second terminal connected to a junction of the first capacitor, the second capacitor, and the emitter resistor. The degenerative resistor varies in resistance with a change in temperature opposite that of an input resistance of the bipolar junction transistor to prevent the fluctuation of the amplitude with temperature.

The first and second capacitors are selected to minimize the effect of variation of the stray capacitance (the parasitic impedance) at the collector of the bipolar junction transistor. The first and second capacitors are related to the magnitude of the stray capacitance by the formula:

$$C_P \ll \frac{C_1 C_2}{C_1 + C_2}$$

where:

$C_P$ is the stray capacitance, $C_1$ is the first capacitance, and $C_2$ is the second capacitance.

The practical embodiment of the oscillator is converted to a frequency shift keying oscillator by adding frequency shifting means to modulate the frequency of the output signal between a first frequency and a second frequency according to a state of a digital input signal. The frequency shifting means has a frequency deviating capacitor connected between a second terminal of the surface acoustic wave resonator and the ground reference point. The frequency shifting means further has a frequency shifting switch. A frequency shifting switch has a first terminal connected to the second terminal of the surface acoustic wave resonator, a second terminal connected to the ground reference point and a control terminal to selectively connect the first terminal to the second terminal according to the state of digital input signal. The method of designing the practical embodiment of the oscillator as a frequency shift keying oscillator requires selecting an on-resistance of the frequency shifting switch. The on-resistance is of a magnitude that will prevent the first frequency and the second frequency from fluctuating with temperature.

BRIEF DESCRIPTION OF THE DRAWINGS

FIG. 1 is a block diagram of a feedback system of the prior art.

FIG. 2 is a block diagram of a common base transistor oscillator of the prior art.

FIG. 3a is a schematic diagram of a typical common base transistor oscillator of the prior art.

FIG. 3b is a schematic diagram of a typical common base transistor oscillator incorporating a Surface Acoustic Wave Resonator of the prior art.

FIG. 4a is a schematic diagram of a typical common base transistor oscillator of the prior art showing the transistor as the equivalent small signal model.

FIG. 4b is a schematic diagram of the open loop form the typical common base transistor oscillator of the prior art showing the transistor as the equivalent small signal model.

FIG. 4c is a simplified schematic diagram of the open loop form the typical common base transistor oscillator of the prior art.

FIGS. 4d and 4e are plots of the open loop gain and phase of the common base transistor oscillator of the prior art versus frequency.

FIG. 4f is schematic diagram of the electrical model of a practical inductor.

FIGS. 5a and 5b are plots of the open loop gain and phase of the common base transistor oscillator incorporating a surface acoustic wave resonator of the prior art versus frequency.

FIGS. 6a is a plot of the open loop phase of the common base transistor oscillator of the prior art versus frequency for several temperatures of operation.

FIGS. 6b is a plot of the open loop phase of the common base transistor oscillator incorporating a surface acoustic wave oscillator of the prior art versus frequency for several temperatures of operation.

DETAILED DESCRIPTION OF THE INVENTION

Figure 7:
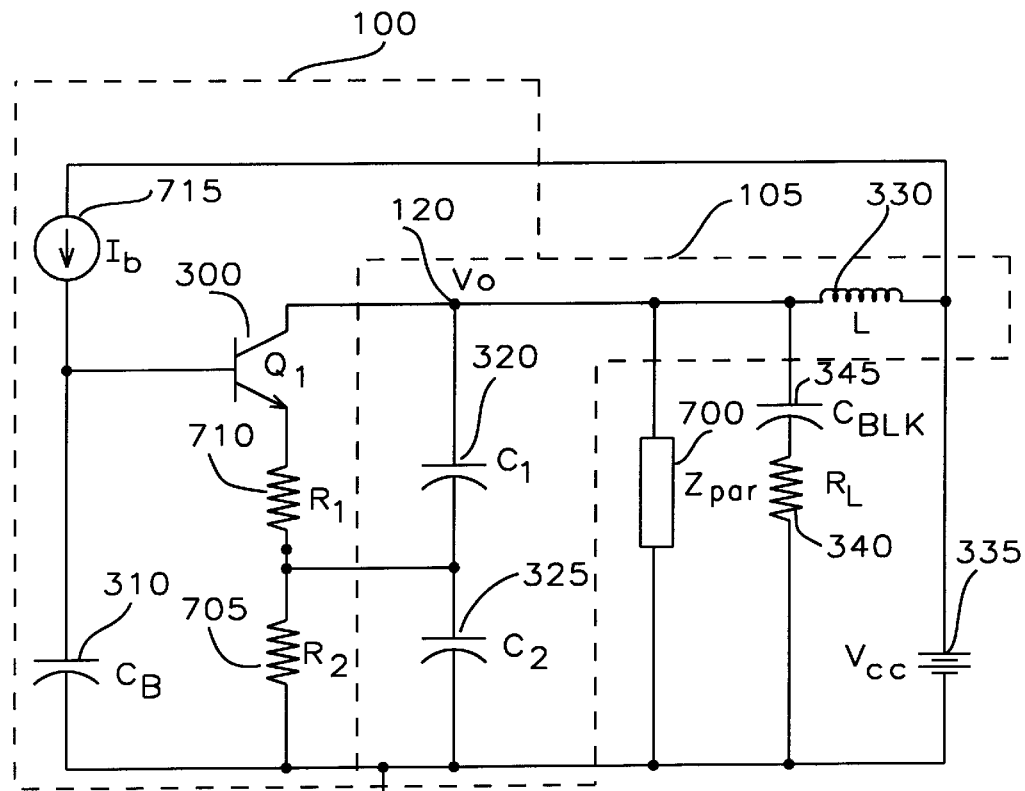
FIG. 7 is a schematic diagram of a common base transistor oscillator of this invention.

For a discussion of the common base transistor oscillator of this invention, refer now to FIG. 7. The gain block 100 is formed of the bipolar junction transistor Q1 300, the base biasing current source $I_b$ 715, the base capacitor $C_B$ 310, the degenerative compensation resistor $R_1$ 710 and the emitter resistor $R_2$ 705.

The feedback circuit 105 is composed of the inductor L 330, the capacitor $C_1$ 320 and the capacitor $C_2$ 325. The operation of the feedback circuit 105 is as described above.

The degenerative compensation resistor $R_1$ 710 is functionally in series with the input resistor $R_i$ 410 of FIG. 4b. The magnitude of the input resistor $R_i$ 410 is typically on the order of 12 Ω and is linearly dependent on the temperature of the transistor Q1 300. To minimize the effect of the temperature of the input resistor $R_i$ 410, the degenerative compensation resistor $R_1$ 710 is chosen to be larger than the input resistor $R_i$ 410 of FIG. 4b. Practically, the degenerative compensation resistor $R_1$ 710 must be less than 50 Ω. It will be observed that the quality factor Q of the circuit will be of the form:

$$Q = \frac{R_p}{\omega_o L}$$

where:

$R_P$ is the parallel combination of the load resistance $R_L$ 340 and the equivalent resistance $R_{eq}$ 415 of FIG. 4c. The resistance $R_{eq}$ 415 of FIG. 4c consists of the input resistor $R_i$ 410 as above described. Thus, the quality factor Q will increase with a larger value of the input resistor $R_i$ 410.

The degenerative compensation resistor $R_1$ 710 is for temperature compensation of the effects of the input resistor $R_i$ 410, while the emitter resistor $R_2$ 705 is strictly for controlling the D.C. biasing of the circuit. Therefore the emitter resistor $R_2$ 705 is much larger than the degenerative compensation resistor $R_1$ 710. The emitter resistor $R_2$ 705 is for practical implementations five times larger than the degenerative compensation resistor $R_1$ 710.

Additionally, as shown above, the equivalent resistor $R_{eq}$ 415 of FIG. 4c is proportional to the square of the capacitance of the first and second capacitors $C_1$ 320 and $C_2$ 325. That is:

$$R_{eq} \propto \left(\frac{C_1 + C_2}{C_1}\right)^2$$

To maximize the effect of the degenerative compensation resistor $R_1$ 710, the first capacitor $C_1$ 320 should be much, much smaller than the second capacitor $C_2$ 325. A good estimate for the value of the second capacitor $C_2$ 325 is:

$$C_2 \geq 6 \times C_1.$$

The value of the second capacitor $C_2$ 325 is established as a function of the open loop gain that is proportional to the function:

$$\frac{C_1 + C_2}{C_1}$$

Additionally, a good estimate of the value of the first capacitor $C_1$ 320 is from two to three times greater than the stray capacitor $C_{stray}$ 420.

Further to minimize the change in amplitude and change in frequency with temperature, the inductor L 330 must have a high Quality Factor (Q). As is fundamental to the art, the Q of an inductor is a measure of the energy stored in the inductor compared to the energy dissipated in the inductor and is:

$$Q = \frac{\omega_o L}{R_s}$$

where $\omega_o$ is the resonant frequency of the oscillator in radians.

$R_s$ is the series resistance of the inductor $R_s$ 440 of FIG. 4f.

The series resistance of the inductor $R_s$ 440 of FIG. 4f is temperature dependent and to minimize the effect of this resistance on the frequency of oscillation and the output amplitude, the series resistance of the inductor $R_s$ 440 should be as small as possible. From the above, higher Q indicates a lower series resistance of the inductor $R_s$ 440.

Further, to prevent drifting of the frequency of oscillation, the inductance of the inductor L 330 must have a minimum temperature dependence. It is known in the art that inductors formed on a semiconductor die have lower Q (6–10) and higher temperature coefficients of inductance. It is also known in the art that discrete inductors formed on an air core or in a ceramic process have higher Q values of from 20 to 40. Therefore the inductor L 330 should be chosen as a discrete inductor having the highest possible Q factor and the lowest possible temperature coefficient of inductance.

The parasitic impedance $Z_{par}$ 700 is the parasitic inductances, capacitances, and resistances of the interconnecting conductors from the collector of the bipolar junction transistor Q1 300 to the first capacitor $C_1$ 320, the load resistance $R_L$ 340, and the discrete inductor L 330.

As is described above, the parasitic impedance $Z_L$ 700 is generally assumed to be only the stray capacitance $C_{stray}$ 420 of FIG. 4c. Any inductance or resistance is considered to be sufficiently small to be ignored.

Figure 8:
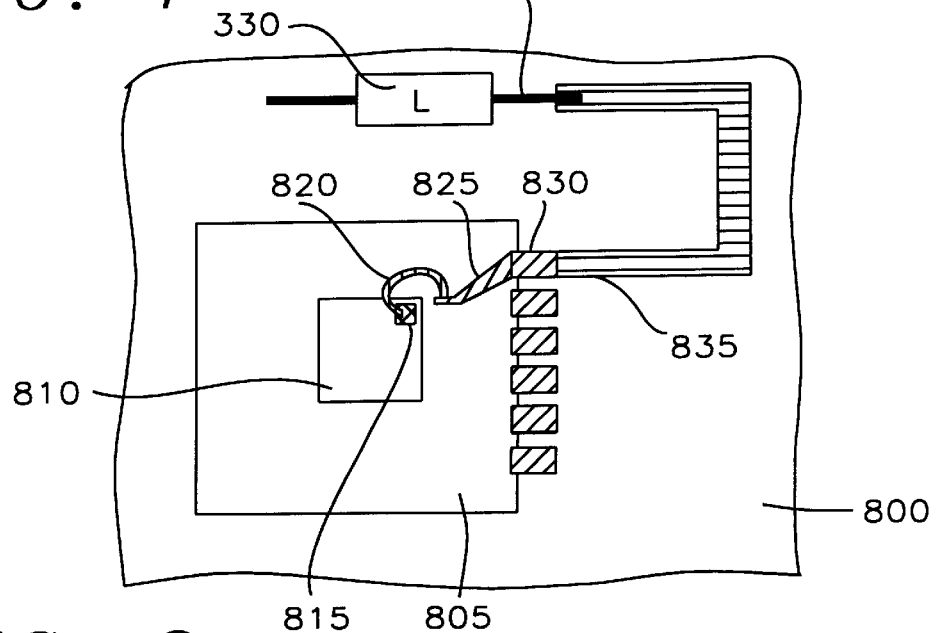
FIG. 8 is a diagram showing the physical packaging components that contribute to the parasitic impedance of FIG. 7.

FIG. 8 shows a diagram of the packaging components that contribute to the parasitic impedance $Z_L$ 700. A semiconductor die 810 is affixed to a chip carrier module 805 that is mounted on a printed circuit card 800. The output node 120 is the interconnection of an input/output pad 815, a wire bond 820, a lead frame trace 825, a package pin or lead 830, a printed circuit wiring trace, and the lead 845 of the inductor L 330. It is well known in the art that each of these components contribute to the inductance, capacitance, and resistance of the parasitic impedance $Z_{par}$ 700.

The design of the common base transistor oscillator of this invention requires the minimization of the parasitic impedance. One method of the minimization of the parasitic impedance $Z_{par}$ 700 is to keep the interconnection path from the collector of the bipolar junction transistor Q1 300 and the discrete inductor L 330 of FIG. 7 as short as possible.

The magnitude of the stray capacitance $C_{stray}$ 420 of the parasitic impedance $Z_L$ 700 has temperature dependent component that is dependent on the output capacitance of the transistor $Q_1$ 300 as described above.

To minimize the temperature effects of this stray capacitance $C_{stray}$ 420, the first capacitor $C_1$ 320, and the second capacitor $C_2$ 325 are much, much larger than the stray capacitance $C_{stray}$ 420 of the parasitic impedance $Z_L$ 700. It has been found that:

$$\frac{C_1 C_2}{C_1 + C_2} > 2 C_{stray}.$$

This is satisfactory to minimize the effects of changes in the stray capacitance $C_{stray}$ 420 of the parasitic impedance $Z_L$ 700 due to temperature.

Figure 9A:
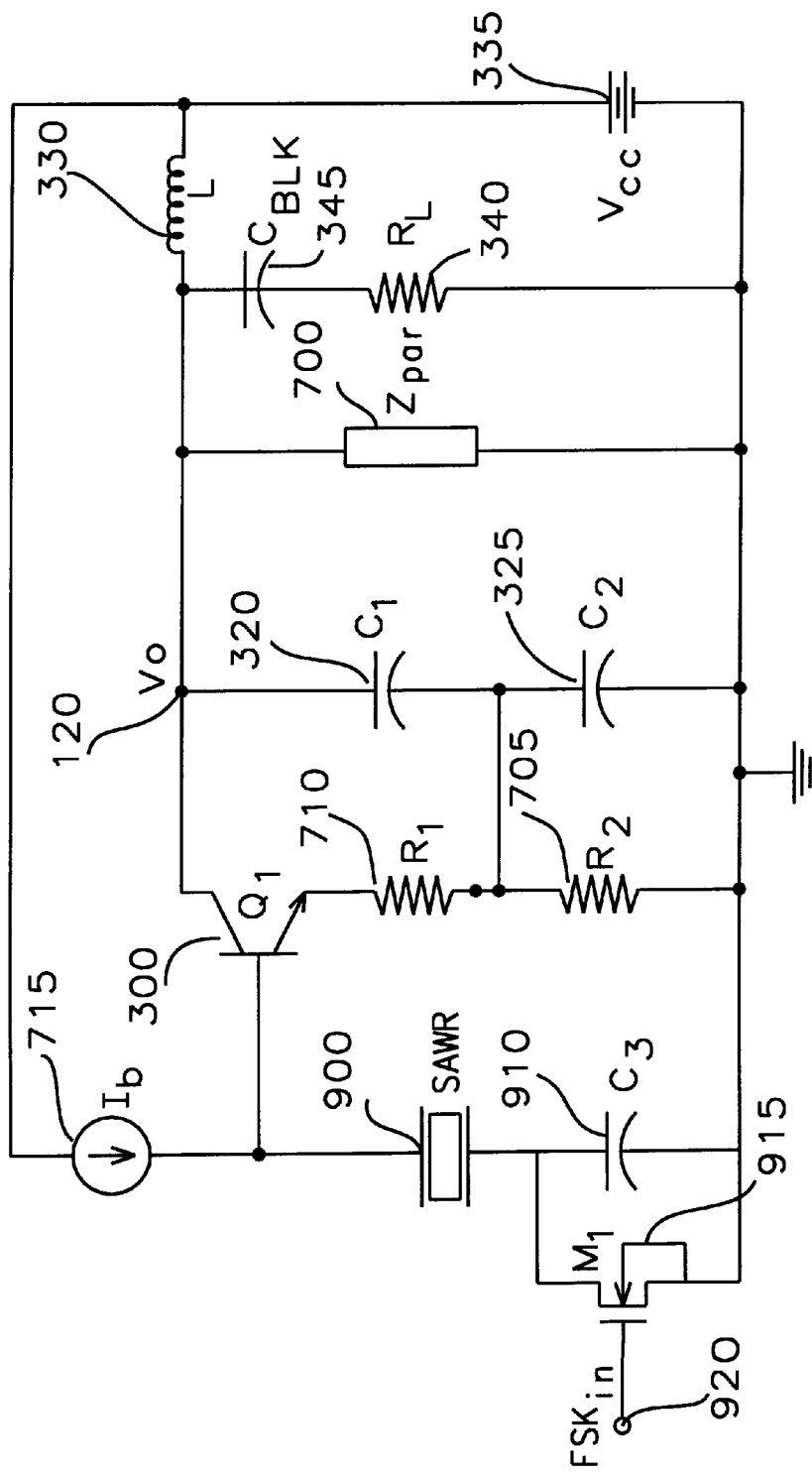
FIG. 9a is a schematic diagram of a common base transistor oscillator incorporating a surface acoustic wave resonator configured as a frequency shift keying oscillator of this invention.
Figure 9B:
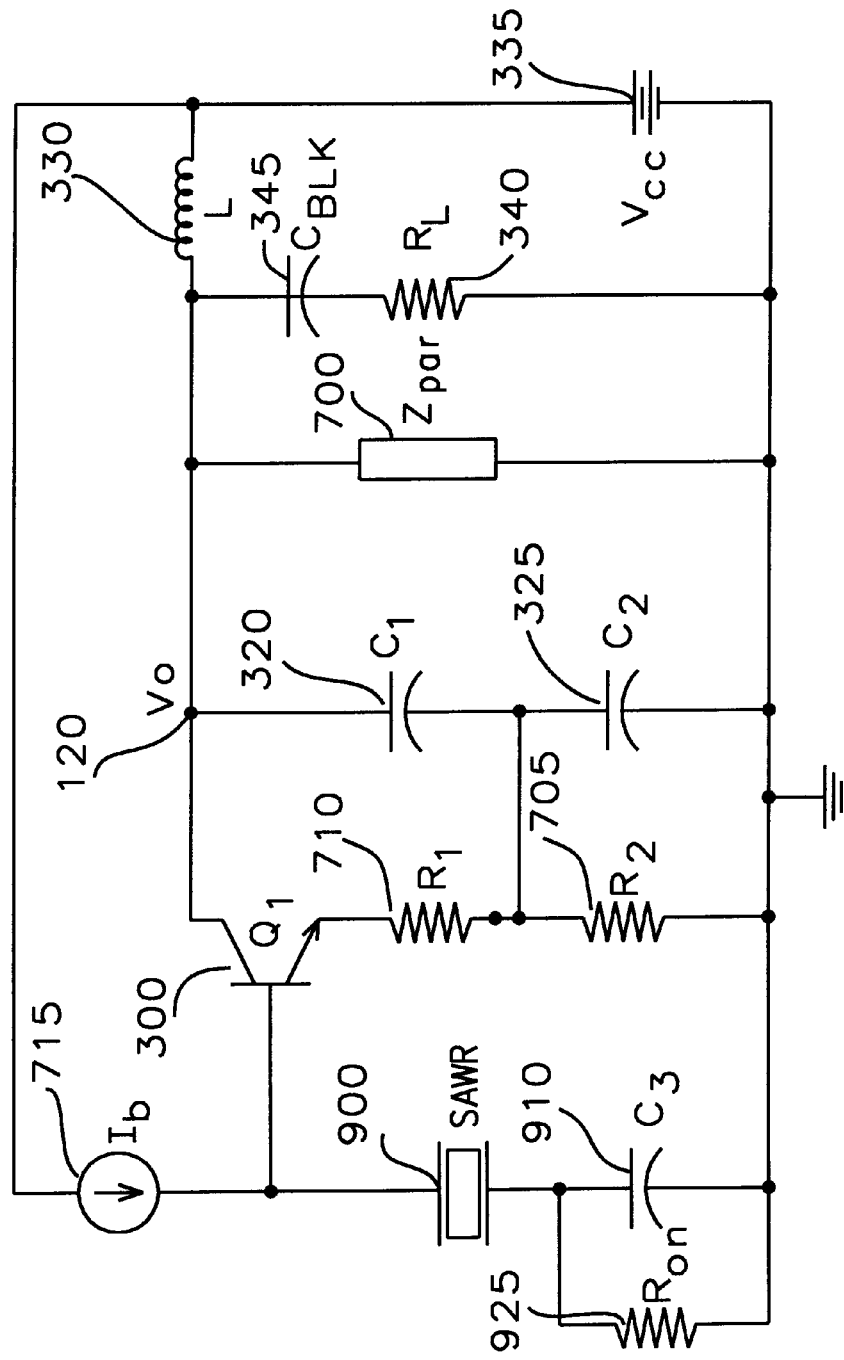
FIG. 9b is a schematic diagram of a common base transistor oscillator incorporating a surface acoustic wave resonator configured as a frequency shift keying oscillator of this invention showing the on-resistance of the MOSFET of the frequency shifting means.
Figure 10:
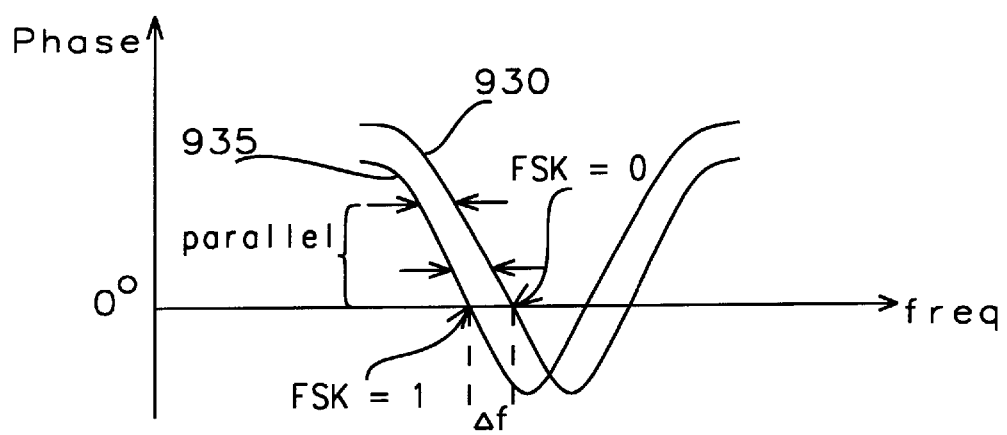
FIG. 10 is a plot of the open loop pha se of the common base transistor oscillator of this invention configured as a frequency shift oscillator of this invention versus frequency.

FIG. 9a shows a common base oscillator of this invention configured as a SAWR FSK oscillator. The base capacitor $C_B$ 310 of FIG. 7 is replaced with the SAWR 900 and the deviation capacitor $C_3$ 910. The deviation capacitor $C_3$ 910 will modify the resonant frequency $f_0$ of the oscillator of this invention from the series resonant frequency $f_s$ of the SAWR as described above. The Metal Oxide Semiconductor Field Effect Transistor (MOSFET) $M_1$ 915 is placed in parallel with the deviation capacitor $C_3$ 910. The FSK control signal $FSK_{in}$ 920 is connected to the gate of the MOSFET $M_1$ 915. If the FSK control signal $FSK_{in}$ 920 is at a first logic level (0), the MOSFET $M_1$ 915 is turned off or not conducting and the resonant frequency of the oscillator is at the first frequency as modified by the deviation capacitor $C_3$ 910. If the FSK control signal $FSK_{in}$ 920 is at a second logic level (1), the MOSFET $M_1$ 915 is turned on or conducting and the deviation capacitor $C_3$ 915 is shunted by the resistor $R_{on}$ 925 of FIG. 1 Ob. The resistor $R_{on}$ 925 is the drain to source resistance of the conducting MOSFET $M_1$ 915 of FIG. 9b and is determined by the width (W) to length (L) ratio of the MOSFET $M_1$ 915. The lower the resistance of the resistor $R_{on}$ 925, the higher the over Quality Factor (Q) of the oscillator. The overall Q factor determines the slope of the curve of the phase. The value of the on-resistance $R_{on}$ 925 of the MOSFET $M_1$ 915 is chosen to ensure that the overall Q factor of the oscillator is maintained such that the slope of the curve 930 of the phase versus frequency FIG. 10 of the oscillator when the MOSFET $M_1$ 915 is turned off (the FSK signal 920 is at the first logic level (0)) and the slope of the curve 935 when the MOSFET M1 915 is turned on (the FSK signal 920 is at the second logic level (1)) are nearly parallel. This will insure a constant frequency shift required for the FSK modulation over temperature.

In summary, the method of designing a practical embodiment of a common base transistor SAWR oscillator of this invention begins by choosing the inductor to have a high quality factor (from approximately 20 to approximately 40) and a low temperature coefficient (25 ppm/° C.–125 ppm/° C.) to prevent fluctuations in the frequency and the amplitude.

The interconnections, which include chip traces, wire bonds, and card traces, are designed to have minimum resistance and minimum stray capacitance from the collector of the bipolar junction transistor the inductor and the first and second capacitances.

A degenerative resistor has a first terminal connected to the emitter of the bipolar transistor and a second terminal connected to a junction of the first capacitor, the second capacitor, and the emitter resistor. The degenerative resistor is chosen to vary in resistance with a change in temperature opposite that of an input resistance of said bipolar junction transistor to prevent the fluctuation of the amplitude with temperature.

The first and second capacitors are selected to minimize the effect of variation of the stray capacitance (the parasitic impedance) at the collector of the bipolar junction transistor. The first and second capacitors are related to the magnitude of the stray capacitance by the formula:

$$C_P \ll \frac{C_1 C_2}{C_1 + C_2}$$

where:
$C_P$ is the stray capacitance,
$C_1$ is the first capacitance, and
$C_2$ is the second capacitance.

The practical embodiment of the oscillator is made a frequency shift keying oscillator by adding frequency shifting circuit to modulate the frequency of said output signal between a first frequency and a second frequency according to a state of a digital input signal. The frequency shifting circuit has a frequency deviating capacitor connected between a second terminal of the surface acoustic wave resonator and the ground reference point. The frequency shifting circuit further has a frequency shifting switch has a first terminal connected to the second terminal of the surface acoustic wave resonator, a second terminal connected to the ground reference point and a control terminal to selectively connect the first terminal to the second terminal according to the state of digital input signal.

The method of designing the practical embodiment of the oscillator as a frequency shift keying oscillator requires selecting an on-resistance of the frequency shifting switch. The on-resistance is of a magnitude that will prevent said first frequency and said second frequency from fluctuating with temperature. In the case of FIG. 9a, the on-resistance is adjusted by appropriately selecting the width to length ratio (W/L) of the MOSFET $M_1$ 915 of FIG. 9a.

While this invention has been particularly shown and described with reference to the preferred embodiments thereof, it will be understood by those skilled in the art that various changes in form and details may be made without departing from the spirit and scope of the invention.

What is claimed is:

1. An oscillator having minimal fluctuation of frequency and amplitude from variation in temperature, comprising:
   an amplifier wherein the frequency and amplitude of an output signal of said amplifier fluctuates with temperature to a first extent;

a compensation-resistance means connected within said amplifier to cause the amplitude, and frequency of said output signal to fluctuate with temperature to a second extent that is opposite to the first extent to compensate said fluctuation to the first extent;

a first impedance connected between an output of said amplifier and a first input of said amplifier;

a second impedance connected between the first input of said amplifier and a second input of said amplifier;

a third impedance connected between the output of said amplifier and the second input of said amplifier; and a parasitic impedance present between the output and the second input of said amplifier herein said input is comprising interconnections of said oscillator to external circuitry and an output impedance of the amplifier wherein the first, second, and third impedances determine the frequency of said oscillator and said third impedance has a high quality factor and a low temperature coefficient to prevent fluctuation of said frequency and amplitude, and wherein said second impedance is much larger than said first impedance which is much larger than said parasitic impedance to minimize temperature effects on frequency of said parasitic impedance.

2. The oscillator of claim 1 wherein the third impedance is an inductor with a quality factor of from approximately 20 to approximately 40.

3. The oscillator of claim 2 wherein the third impedance is an inductor with a temperature coefficient of from approximately 25 ppm/° C. to approximately 125 ppm/° C.

4. The oscillator of claim 1 wherein the second impedance has a value that is greater than six times that of the first impedance.

5. The oscillator of claim 1 wherein the first impedance has a value that is from approximately two times to approximately three time the value of the parasitic impedance.

6. The oscillator of claim 1 wherein the first and second impedances are capacitors having low temperature coefficients.

7. The oscillator of claim 4 wherein the parasitic impedance is related to the first and second impedance by the formula:

$$C_P \ll \frac{C_1 C_2}{C_1 + C_2}$$

where:
$C_P$ is the parasitic impedance,
$C_1$ is the first impedance, and
$C_2$ is the second impedance.

8. The oscillator of claim 1 wherein an amplifier biasing resistance within the amplifier has a value that is greater than five time larger than a the value of the compensation-resistance means.

9. The oscillator of claim 1 wherein the compensation-resistance means has a value that is less than 50 Ω.

10. The oscillator of claim 1 further comprising a frequency shifting means connected to said amplifier to modulate the frequency of said output signal between a first frequency and a second frequency according to a state of a digital input signal to make said oscillator a frequency shift keying oscillator.

11. The oscillator of claim 10 wherein said frequency shifting means has an on-resistance, whereby said on-resistance is of a magnitude that will prevent said first frequency and said second frequency from fluctuating with temperature.

12. An oscillator having minimal fluctuation of frequency and amplitude from variation in temperature, comprising:

a bipolar junction transistor having a collector, emitter, and a base;

a biasing means connected between a power supply voltage source and the base of the bipolar junction transistor to provide a biasing for said bipolar junction transistor;

a surface acoustic wave resonator having a first terminal connected to the base of the transistor to control the frequency of oscillation.

a degenerative resistor having a first terminal connected to the emitter wherein the degenerative resistor varies in resistance with a change in temperature opposite that of an input resistance of said bipolar junction transistor to prevent the fluctuation of the amplitude with temperature;

an emitter resistor connected between a second terminal of the degenerative resistor and a ground reference point;

a first capacitor connected between the collector of the bipolar junction transistor and the second terminal of the degenerative resistor;

a second capacitor connected between the second terminal of the degenerative resistor and the ground reference point;

an inductor connected between the collector of the bipolar junction transistor and the power supply voltage source;

wherein the frequency of oscillation of said oscillator is determined by a parallel combination of the inductor and a series combination of the first and second capacitances, and wherein the inductor has a high quality factor and a low coefficient of variation with temperature to prevent fluctuation of the frequency and the amplitude with changes in temperature.

13. The oscillator of claim 12 wherein the quality factor of the inductor is from approximately 20 to approximately 40.

14. The oscillator of claim 12 wherein the inductor has a temperature coefficient of from approximately 25 ppm/° C. to approximately 125 ppm/° C.

15. The oscillator of claim 12 wherein the second capacitor has a value that is greater than six time the value of the first capacitor.

16. The oscillator of claim 12 wherein the first and second capacitors have low temperature coefficients.

17. The oscillator of claim 12 further comprising a parasitic capacitor present from the collector of the bipolar junction transistor and the ground reference point, wherein said parasitic capacitor is form of interconnections from the collector of the bipolar junction transistor to the first capacitor, the inductor and external circuitry and wherein the parasitic capacitor is related to the first and second capacitors by the formula:

$$C_P \ll \frac{C_1 C_2}{C_1 + C_2}$$

where:
$C_P$ is the parasitic capacitance,
$C_1$ is the first capacitance, and
$C_2$ is the second capacitance.

18. The oscillator of claim 17 wherein the first capacitor has a value that is from approximately two times to approximately three time the value of the parasitic capacitor.

19. The oscillator of claim 12 wherein an emitter resistor has a value that is greater than five time larger than a the value of the degenerative resistor.

20. The oscillator of claim 12 wherein the degenerative resistor has a value that is less than 50 Ω.

21. The oscillator of claim 12 further comprising a frequency shifting means to modulate the frequency of said output signal between a first frequency and a second frequency according to a state of a digital input signal to make said oscillator a frequency shift keying oscillator, comprising:

frequency deviating capacitor connected between a second terminal of the surface acoustic wave resonator and the ground reference point; and a frequency shifting switch having a first terminal connected to the second terminal of the surface acoustic wave resonator, a second terminal connected to the ground reference point and a control terminal to selectively connect the first terminal to the second terminal according to the state of digital input signal.

22. The oscillator of claim 21 wherein said frequency shifting switch has an on-resistance, whereby said on-resistance is of a magnitude that will prevent said first frequency and said second frequency from fluctuating with temperature.

23. A method for creating an oscillator to minimize fluctuation of frequency and amplitude from variation in temperature, wherein said oscillator comprises:

a bipolar junction transistor having a collector, emitter, and a base, a biasing means connected between a power supply voltage source and the base of the bipolar junction transistor to provide a biasing for said bipolar junction transistor, a surface acoustic wave resonator having a first terminal connected to the base of the transistor to control the frequency of oscillation, an emitter resistor having a first terminal connected to a ground reference point, a first capacitor connected between the collector of the bipolar junction transistor and the second terminal of the emitter resistor, a second capacitor connected between the second terminal of the emitter resistor and the ground reference point, and an inductor connected between the collector of the bipolar junction transistor and the power supply voltage source, and wherein said method comprises the steps of:

choosing the inductor having a high quality factor and a low temperature coefficient to prevent fluctuations in the frequency and the amplitude;

designing interconnections which include chip traces, wire bonds, and card traces to have minimum resistance and minimum stray capacitance from the collector of the bipolar junction transistor the inductor and the first and second capacitances;

placing a degenerative resistor having a first terminal connected to the emitter of the bipolar transistor and a second terminal connected to a junction of the first capacitor, the second capacitor, and the emitter resistor, wherein the degenerative resistor varies in resistance with a change in temperature opposite that of an input resistance of said bipolar junction transistor to prevent the fluctuation of the amplitude with temperature; and selecting the first and second capacitors to minimize the effect of variation of the stray capacitance at the collector of the bipolar junction transistor.

24. The method of claim 23 wherein the quality factor of the inductor is from approximately 20 to approximately 40.

25. The method of claim 23 wherein the inductor has a temperature coefficient of from approximately 25 ppm/° C. to approximately 125 ppm/° C.

26. The method of claim 23 wherein the second capacitor has a value that is greater than six time the value of the first capacitor.

27. The method of claim 23 wherein the first capacitor has a value that is from approximately two times to approximately three time the value of the stray capacitance.

28. The method of claim 23 wherein the first and second capacitors have low temperature coefficients.

29. The method of claim 23 wherein the stray capacitance is related to the first and second capacitors by the formula:

$$C_P \ll \frac{C_1 C_2}{C_1 + C_2}$$

where:

$C_P$ is the stray capacitance, $C_1$ is the first capacitance, and $C_2$ is the second capacitance.

30. The method of claim 23 wherein an emitter resistor has a value that is greater than five time larger than a the value of the degenerative resistor.

31. The method of claim 23 wherein the degenerative resistor has a value that is less than 50 Ω.

32. The method of claim 23 wherein said oscillator is further comprising a frequency shifting means to modulate the frequency of said output signal between a first frequency and a second frequency according to a state of a digital input signal to make said oscillator a frequency shift keying oscillator, comprising:

frequency deviating capacitor connected between a second terminal of the surface acoustic wave resonator and the ground reference point; and a frequency shifting switch having a first terminal connected to the second terminal of the surface acoustic wave resonator, a second terminal connected to the ground reference point and a control terminal to selectively connect the first terminal to the second terminal according to the state of digital input signal; and wherein said method further comprises the step of:

selecting an on-resistance, whereby said on-resistance is of a magnitude that will prevent said first frequency and said second frequency from fluctuating with temperature.

* * * * *